United States Patent
Imai et al.

(10) Patent No.: US 8,294,143 B2
(45) Date of Patent: Oct. 23, 2012

(54) DISPLAY UNIT INCLUDING A MULTLAYER STRUCTURE

(75) Inventors: Toshiaki Imai, Kanagawa (JP); Shigeyuki Matsunami, Fukuoka (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 63 days.

(21) Appl. No.: 12/899,133

(22) Filed: Oct. 6, 2010

(65) Prior Publication Data
US 2011/0095276 A1    Apr. 28, 2011

(30) Foreign Application Priority Data
Oct. 22, 2009 (JP) ................. P2009-243689

(51) Int. Cl.
*H01L 29/08* (2006.01)
(52) U.S. Cl. ............ 257/40; 257/89; 257/E51.022
(58) Field of Classification Search .......... 257/40, 257/89, E51.018, E51.022, E33.001; 438/99; 362/230–231, 236, 242
See application file for complete search history.

(56) References Cited

U.S. PATENT DOCUMENTS
2006/0082295 A1* 4/2006 Chin et al. ............ 313/506

FOREIGN PATENT DOCUMENTS
JP    2006-324016    11/2006
* cited by examiner

*Primary Examiner* — Tucker Wright
(74) *Attorney, Agent, or Firm* — K&L Gates LLP

(57) ABSTRACT

A display unit that secures favorable display performance and has a simple structure is provided. The display unit includes a multilayer structure in which an organic light emitting device group respectively having a plurality of organic light emitting devices that emits cyan light and a plurality of organic light emitting devices that emits magenta light and a color filter group having a plurality of blue filters that transmit blue light and a plurality of yellow filters that transmit yellow light are sequentially layered. In the display unit, the cyan light and the magenta light entering from the organic light emitting device group to the color filter group is converted to blue light by the blue filter, and is respectively converted to green light and red light by the yellow filter. Therefore, compared to a case that the organic light emitting device group emits white light, color separation is more facilitated.

7 Claims, 12 Drawing Sheets

DISPLAY UNIT INCLUDING A MULTLAYER STRUCTURE

CROSS REFERENCES TO RELATED APPLICATIONS

The present application claims priority to Japanese Priority Patent Application JP 2009-243689 filed in the Japan Patent Office on Oct. 22, 2009, the entire content of which is hereby incorporated by reference.

BACKGROUND

The present application relates to a display unit that includes a self-light emitting type organic light emitting device.

In recent years, as a display unit replacing a liquid crystal display, an organic EL (Electro Luminescence) display unit using a self-light emitting type organic EL device including an organic layer has been practically used. Since the organic EL display unit is a self-light emitting type display unit, its view angle is wider than that of the liquid crystal display unit or the like. Further, the organic EL display unit has sufficient response to a high-definition and high-speed video signal.

As one of such organic EL display units, an organic EL display that has a combination structure of an organic light emitting device that emits white light (hereinafter referred to as a white light emitting device) and a color filter has been known. By adopting such a structure, a full color display unit is able to be comparatively easily fabricated without separately forming each organic light emitting device that emits each color, that is, without performing fine separate coating operation using a metal mask in forming a light emitting layer.

The white light emitting device has a structure in which, for example, two light emitting layers are layered in one light emitting unit sandwiched between an anode and a cathode, the two light emitting layers simultaneously emit light, and therefore white light emission is extracted as a whole.

Other examples of the white light emitting device include a so-called tandem type light emitting device in which a plurality of light emitting units are layered between a cathode and an anode with a charge generation layer in between (for example, refer to Japanese Unexamined Patent Application Publication No. 2006-324016). In the tandem type light emitting device, the plurality of light emitting units respectively having one or more light emitting layers are included. Whole light emitting color becomes white by overlapping respective light emitting colors from the respective light emitting units each other.

SUMMARY

In the display unit including the white light emitting device disclosed in the foregoing Japanese Unexamined Patent Application Publication No. 2006-324016, low voltage drive is enabled, and superior performance with favorably controlled light emitting balance is demonstrated. However, in the combination of the white light emitting device and the color filter, sufficient color separation is not performed without increasing the thickness of the color filter to some extent. In recent years, further improving light emitting efficiency and improving compact characteristics have been increasingly demanded. However, it becomes increasingly difficult to sufficiently satisfy such a demand with the use of the display unit of the foregoing Japanese Unexamined Patent Application Publication No. 2006-324016. Thus, a display unit that has a compact structure and that has high light emitting efficiency has been desired.

In view of the foregoing, in the application, it is desirable to provide a display unit that secures favorable display performance and has a simpler structure.

According to an embodiment, there is provided a display unit including a multilayer structure in which a light emitting device group that respectively has a plurality of cyan organic light emitting devices emitting cyan light and a plurality of magenta organic light emitting devices emitting magenta light and a color filter group that has a plurality of blue filters transmitting blue light and a plurality of yellow filters transmitting yellow light are sequentially layered over a substrate.

In the display unit of the embodiment, the cyan light and the magenta light are emitted from the light emitting device group, and the cyan light and the magenta light entering the color filter group is both converted to the blue light by the blue filter and is respectively converted to green light and red light by the yellow filter. Therefore, compared to a case that the light emitting device group emits white light, color separation is favorably performed even if the thickness of the color filter group is decreased.

According to another embodiment, there is provided a display unit including a multilayer structure in which a light emitting device group that respectively has a plurality of cyan organic light emitting devices emitting cyan light and a plurality of magenta organic light emitting devices emitting magenta light and a color filter group that has a plurality of red filters transmitting red light, a plurality of green filters transmitting green light, and a plurality of blue filters transmitting blue light are sequentially layered over a substrate.

In the display unit of the embodiment, the cyan light and the magenta light is emitted from the light emitting device group, and the cyan light and the magenta light enters the color filter group. The cyan light is converted to the blue light by the blue filter, or is converted to the green light by the green filter. Meanwhile, the magenta light is converted to the blue light by the blue filter, or is converted to the red light by the red filter. Therefore, compared to a case that the light emitting device group emits white light, color separation is favorably performed even if the thickness of the color filter group is decreased.

According to still another embodiment, there is provided a display unit including a multilayer structure in which a light emitting device group that has at least two of a plurality of cyan organic light emitting devices emitting cyan light, a plurality of magenta organic light emitting devices emitting magenta light, and a plurality of yellow organic light emitting devices emitting yellow light and a color filter group that has a plurality of red filters transmitting red light, a plurality of green filters transmitting green light, and a plurality of blue filters transmitting blue light are sequentially layered over a substrate.

In the display unit of the embodiment, at least two of the cyan light, the magenta light, and the yellow light is emitted from the light emitting device group, and the emitted light enters the color filter group. The cyan light is converted to the blue light by the blue filter, or is converted to the green light by the green filter. The magenta light is converted to the blue light by the blue filter, or is converted to the red light by the red filter. The yellow light is converted to the green light by the green filter, or is converted to the red light by the red filter. Therefore, compared to a case that the light emitting device group emits white light, color separation is favorably performed even if the thickness of the color filter group is decreased.

According to the display unit of the embodiments of the application, the light emitting device group has a plurality of organic light emitting devices that respectively emit the cyan light, the magenta light, or the yellow light. Thus, compared to a case that the light emitting device group emits white light, the thickness of the color filter group is able to be decreased while the color purity is maintained. In the result, the whole light emitting efficiency is improved, and the thickness of the whole structure is able to be decreased.

Additional features and advantages are described herein, and will be apparent from the following Detailed Description and the figures.

DETAILED DESCRIPTION

Embodiments of the present application will be described in detail hereinafter with reference to the drawings.

First Embodiment

Whole Structure of a Display Unit

Figure 1:
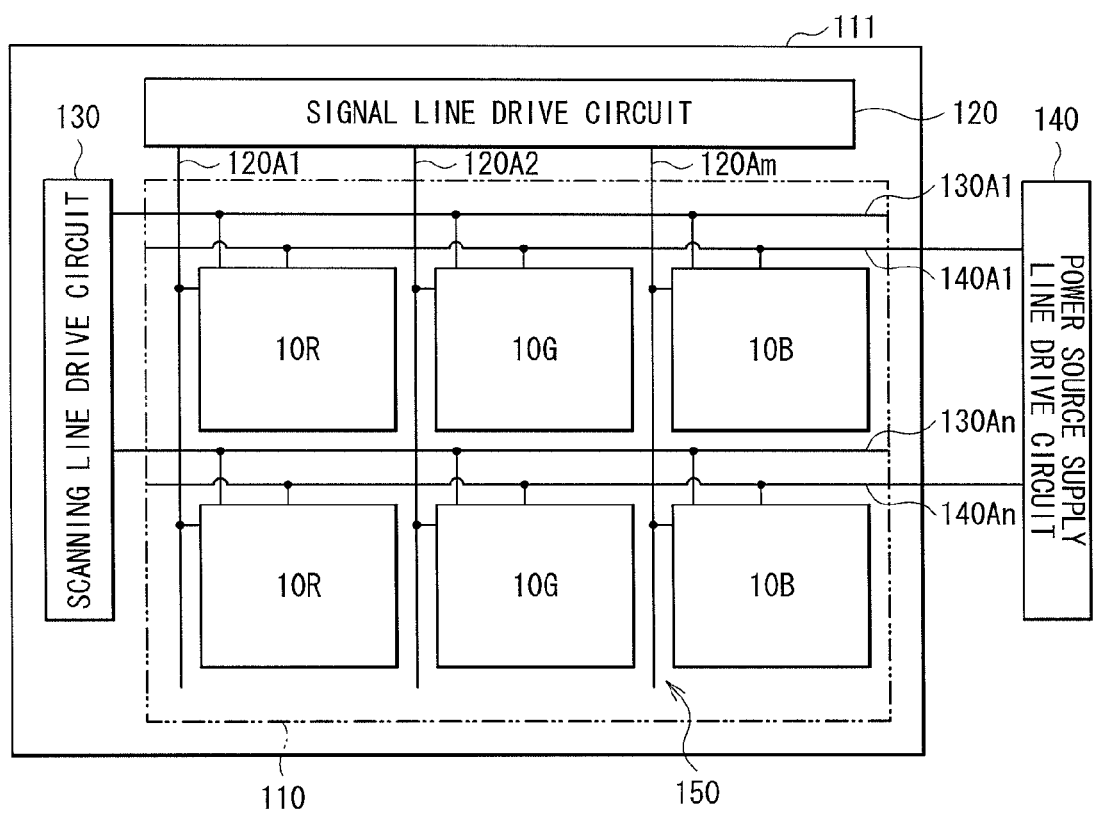
FIG. 1 is a view illustrating a structure of a display unit according to a first embodiment.

FIG. 1 is a view illustrating a structure of a display unit using an organic light emitting device according to a first embodiment. The display unit is used as an ultrathin organic light emitting color display unit or the like. In the display unit, a display region 110 is formed on a substrate 111. Around the display region 110 on the substrate 111, for example, a signal line drive circuit 120, a scanning line drive circuit 130, and a power source supply line drive circuit 140 that are drivers for displaying a video are formed.

In the display region 110, a plurality of display devices 10 (10R, 10G, and 10B) that are two-dimensionally arranged in a matrix state and a pixel drive circuit 150 for driving the same are formed. In the pixel drive circuit 150, a plurality of signal lines 120A (120A1, 120A2, . . . , 120Am, . . . ) are arranged in the column direction, and a plurality of scanning lines 130A (130A1, . . . , 130An, . . . ) and a plurality of power source supply lines 140A (140A1, . . . , 140An, . . . ) are arranged in the row direction. One of the display devices 10R, 10G, and 10B is provided correspondingly to each intersection of each signal line 120A and each scanning line 130A. Each signal line 120A is connected to the signal line drive circuit 120, and each scanning line 130A is connected to the scanning line drive circuit 130, and each power source supply line 140A is connected to the power source supply line drive circuit 140.

The signal line drive circuit 120 supplies a signal voltage of a video signal corresponding to luminance information supplied from a signal supply source (not illustrated) to the display devices 10R, 10G, and 10B selected through the signal line 120A.

The scanning line drive circuit 130 is composed of a shift resistor or the like that sequentially shifts (transfers) a start pulse in synchronization with an input clock pulse. The scanning line drive circuit 130 scans writing of the video signal into the respective display devices 10R, 10G, and 10B in units of row, and sequentially supplies a scanning signal to each scanning line 130A.

The power source supply line drive circuit 140 is composed of a shift resistor or the like that sequentially shifts (transfers) the start pulse in synchronization with the input clock pulse. The power source supply line drive circuit 140 supplies one of a first electric potential and a second electric potential that are different from each other as appropriate to each power source supply line 140 in synchronization with the scanning in units of row by the scanning line drive circuit 130. Therefore, conduction state or non conduction state of an after-mentioned drive transistor Tr1 is selected.

Figure 2:
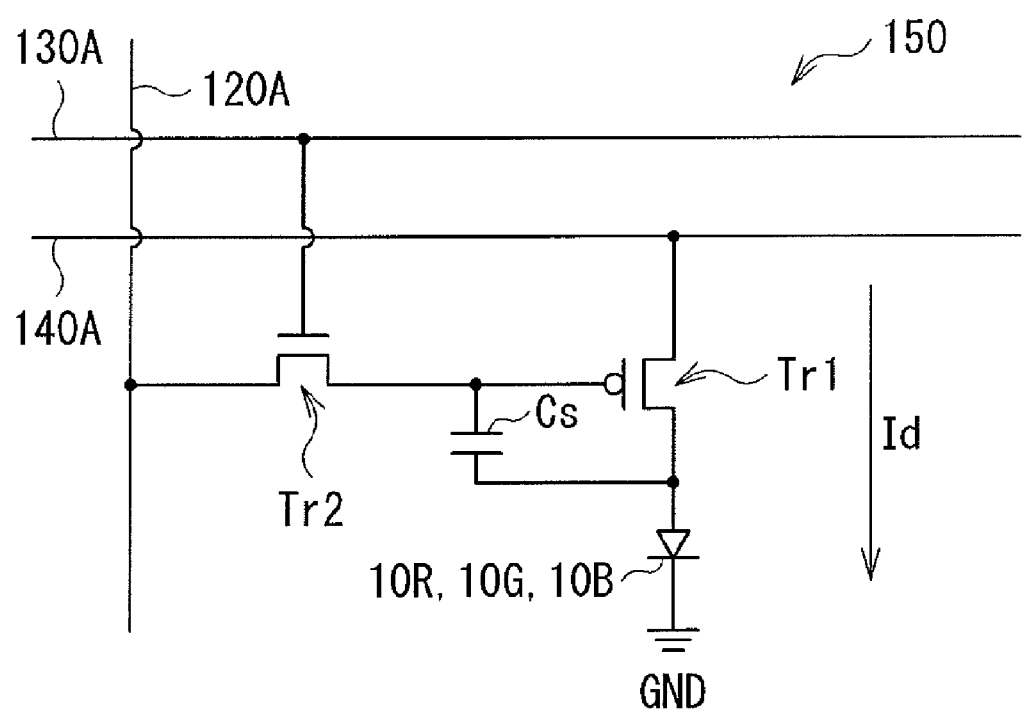
FIG. 2 is a view illustrating an example of the pixel drive circuit illustrated in FIG. 1.

The pixel drive circuit 150 is provided in a layer between the substrate 111 and the display device 10 (after-mentioned pixel drive circuit formation layer 112). FIG. 2 is a view illustrating a structural example of the pixel drive circuit 150. As illustrated in FIG. 2, the pixel drive circuit 150 is an active type drive circuit having the drive transistor Tr1, a writing transistor Tr2, a capacitor (retentive capacity) Cs between the drive transistor Tr1 and the writing transistor Tr2, and the display device 10. The display device 10 is serially connected to the drive transistor Tr1 between the power source supply line 140A and a common power source supply line (GND). The drive transistor Tr1 and the writing transistor Tr2 are composed of a general thin film transistor (TFT). The structure thereof is not particularly limited, and may be, for example, inversely staggered structure (so-called bottom gate type) or staggered structure (top gate type).

For example, a drain electrode of the writing transistor Tr2 is connected to the signal line 120A. The video signal from the signal line drive circuit 120 is supplied to the drain electrode of the writing transistor Tr2. A gate electrode of the writing transistor Tr2 is connected to the scanning line 130A. The scanning signal from the scanning line drive circuit 130 is supplied to the gate electrode of the writing transistor Tr2. Further, a source electrode of the writing transistor Tr2 is connected to a gate electrode of the drive transistor Tr1.

For example, a drain electrode of the drive transistor Tr1 is connected to the power source supply line 140A, and is set to one of the first electric potential and the second electric potential supplied from the power source supply line drive circuit 140. A source electrode of the drive transistor Tr1 is connected to the display device 10.

The retentive capacity Cs is formed between the gate electrode of the drive transistor Tr1 (source electrode of the writing transistor Tr2) and the source electrode of the drive transistor Tr1.

Structure of the Display Region

In the display region 110, one display device 10R, one display device 10G, and one display device 10B structure a pixel 1 (described later) as one display unit. In other words, in the display region 110, the plurality of pixels 1 are sequentially arranged in a matrix state as a whole. The display device 10R displays red light R, the display device 10G displays green light G, and the display device 10B displays blue light B.

Figure 3:
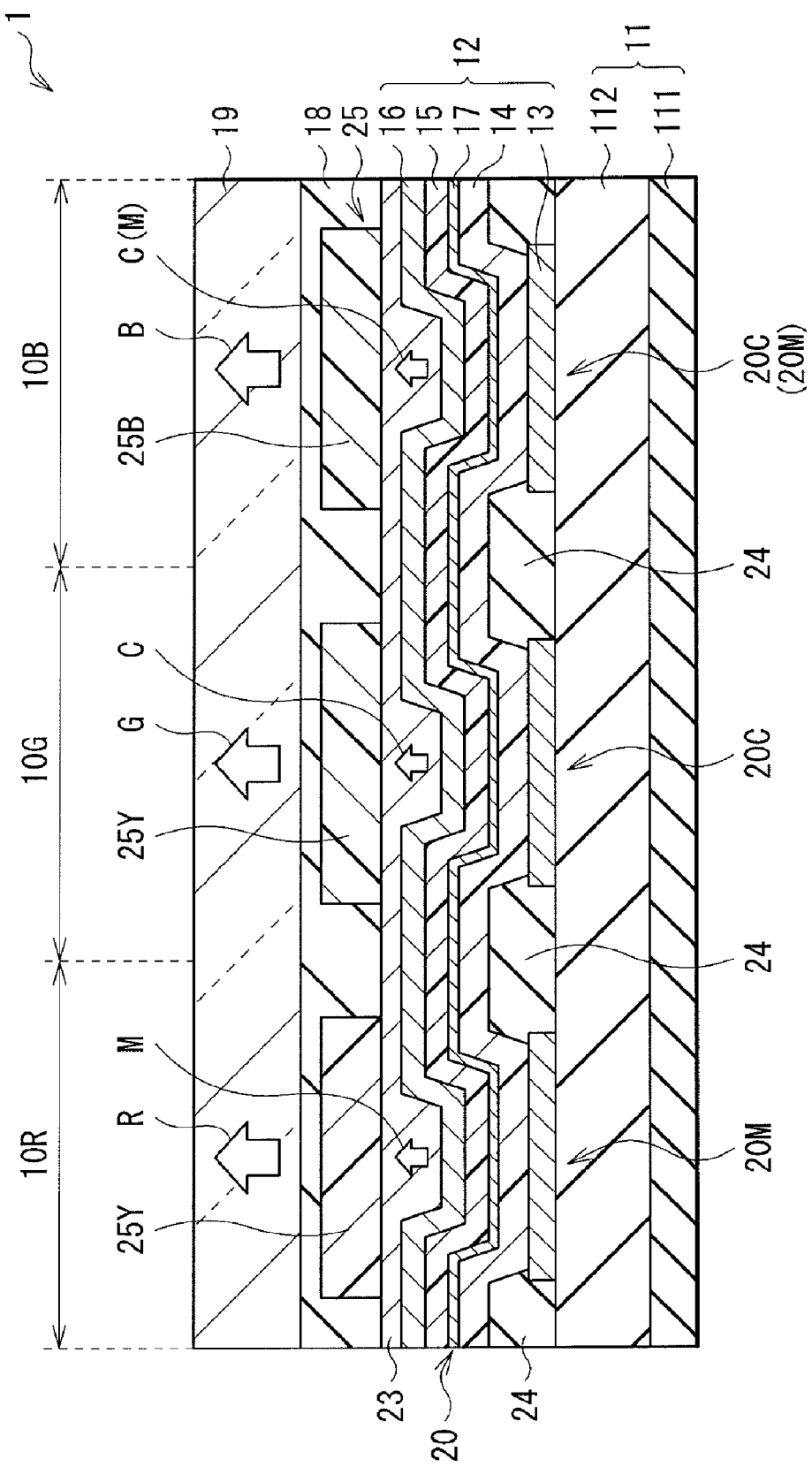
FIG. 3 is a cross sectional view illustrating a schematic structure of the display device in the display region illustrated in FIG. 1.

FIG. 3 is a cross sectional view illustrating a schematic structure of a given pixel 1 in the display region 110. As illustrated in FIG. 3, in the display region 110, on a base substance 11 in which the pixel drive circuit formation layer 112 is provided on the substrate 111, a light emitting device formation layer 12 including an organic light emitting device group 20 is formed. On the light emitting device formation layer 12, a protective layer 18 in which a color filter group 25 is buried and a sealing substrate 19 are sequentially provided.

The substrate 111 is made of glass, a silicon (Si) wafer, a resin or the like. In the pixel drive circuit formation layer 112, the pixel drive circuit 150 is formed.

In the organic light emitting device group 20, a plurality of organic light emitting devices 20C that emit cyan light C and a plurality of organic light emitting devices 20M that emit magenta light M are respectively arranged on the top face of the base substance 11. Further, in the color filter group 25, a plurality of blue filters 25B that transmit blue light (for example, light from 400 nm to less than 500 nm) and a plurality of yellow filters 25Y that transmit, for example, 70% or more of yellow light (for example, light from 500 nm to less than 700 nm) are arranged along the bottom face of the sealing substrate 19. In this case, some yellow filters 25Y are arranged in a position corresponding to the organic light emitting device 20C to transmit the cyan light C. The other yellow filters 25Y are arranged in a position corresponding to the organic light emitting device 20M to transmit the magenta light M. Further, the plurality of blue filters 25B are arranged to transmit at least one of the cyan light C from the organic light emitting device 20C and the magenta light M from the organic light emitting device 20M.

For example, as illustrated in FIG. 3, the display device 10R displays the red light R by combination of the organic light emitting device 20M and the yellow filter 25Y. Similarly, the display device 10G displays the green light G by combination of the organic light emitting device 20C and the yellow filter 25Y. The display device 10B displays the blue light B by combination of the organic light emitting device 20C and the blue filter 25B, or displays the blue light B by combination of the organic light emitting device 20M and the blue filter 25B.

Figure 4:
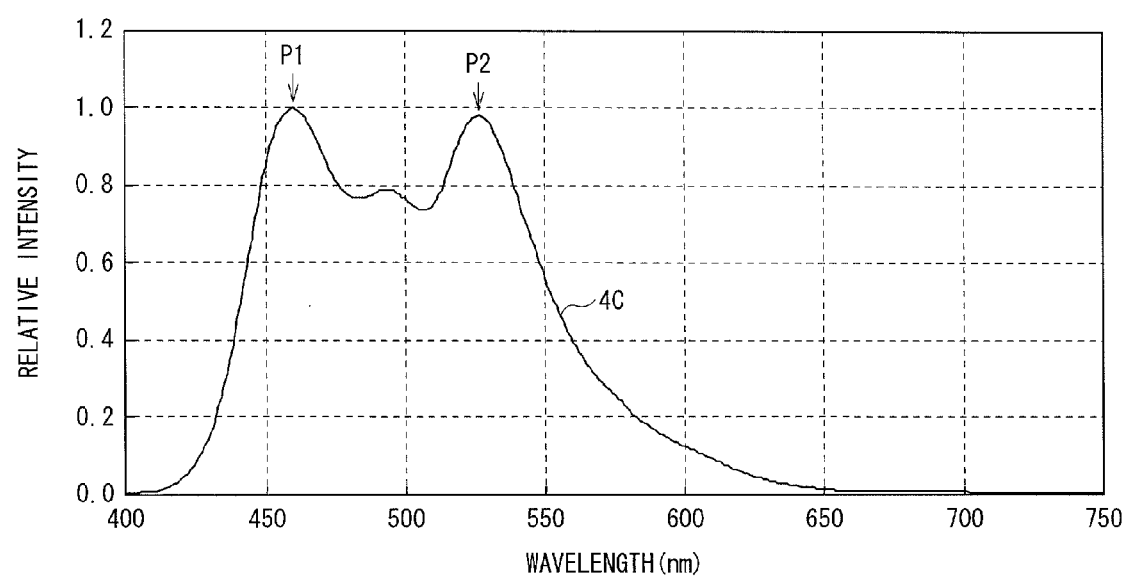
FIG. 4 is a characteristics diagram illustrating an intensity distribution of cyan light.
Figure 5:
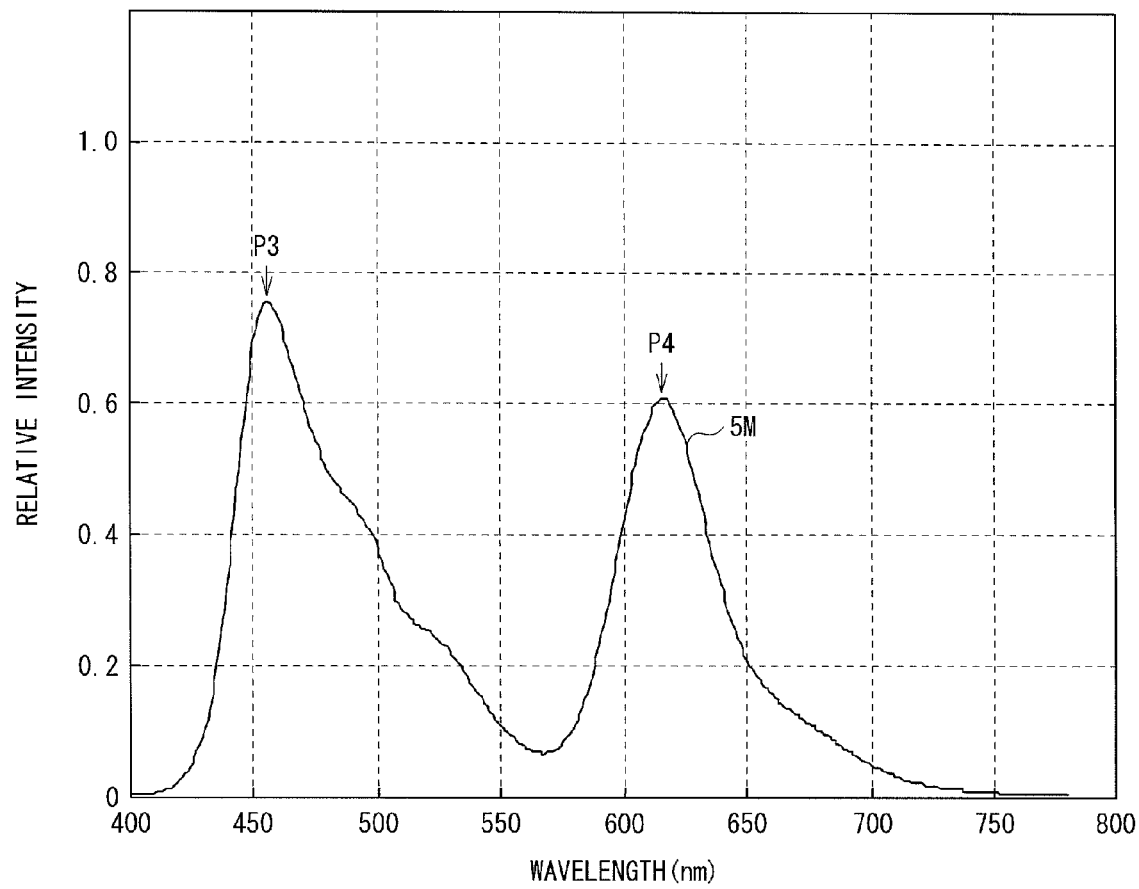
FIG. 5 is a characteristics diagram illustrating an intensity distribution of magenta light.

The cyan light C is, for example, light having wavelength dependence of intensity indicated by curved line 4C of FIG. 4. In FIG. 4, the vertical axis represents a relative intensity, and the horizontal axis represents a wavelength [nm]. In other words, the cyan light C has first peak P1 indicating the maximum value in the range from 400 nm to 500 nm both inclusive and second peak P2 indicating the maximum value in the range from 500 nm to 580 nm both inclusive in the intensity distribution. The first peak P1 or the second peak P1 indicates the maximum intensity. The magenta light M is, for example, light having wavelength dependability of intensity indicated by curved line 5M of FIG. 5. In FIG. 5, the vertical axis represents a relative intensity, and the horizontal axis represents a wavelength [nm]. In other words, the magenta light M has third peak P3 indicating the maximum value in the range from 400 nm to 500 nm both inclusive and fourth peak P4 indicating the maximum value in the range from 600 nm to 700 nm both inclusive in the intensity distribution. The third peak P3 or the fourth peak P4 indicates the maximum intensity.

In the organic light emitting devices 20C and 20M, a first electrode layer 13 as an anode, a first organic layer 14, a connection layer 17, a second organic layer 15, and a second electrode layer 16 as a cathode are sequentially layered from the base substance 11 side. The first electrode layer 13 is separated for every display device 10R, 10G, and 10B by a device separation layer 24. Meanwhile, the first organic layer 14, the connection layer 17, the second organic layer 15, and the second electrode layer 16 are commonly provided for all the display devices 10R, 10G, and 10B. However, a charge control layer 144 (not illustrated in FIG. 3) included in the first organic layer 14 of the organic light emitting device 20C is made of a material different from that of the charge control layer 144 included in the first organic layer 14 of the organic light emitting device 20M. Further, the second electrode layer 16 is covered with a protective layer 23. The top face of the protective layer 23 is planarized. The protective layer 23 is made of an insulating material such as silicon nitride (SiNx). In FIG. 3, detailed structure of the drive transistor Tr1, the writing transistor Tr2 and the like in the pixel drive circuit formation layer 112 are not illustrated.

The device separation layer 24 is provided to fill in a gap between the respective first electrode layers 13 in adjacent display devices 10. The device separation layer 24 is made of an organic material having electric insulation properties such as polyimide. The device separation layer 24 secures electric insulation properties between the respective first electrode layers 13, and accurately determines a desired shape of the light emitting regions of the organic light emitting devices 20C and 20M.

The protective layer 18 covering the light emitting device formation layer 12 is made of an insulating material such as silicon nitride as the protective layer 23 is. Further, the sealing substrate 19 provided thereon seals the display device 10 together with the protective layer 18 and an adhesive layer (not illustrated). The sealing substrate 19 is made of a material such as transparent glass that transmits light generated in the first organic layer 14 and the second organic layer 15.

Structure of Organic Light Emitting Device

Next, a description will be given of detailed structures of the organic light emitting devices 20C and 20M with reference to FIG. 6. The organic light emitting devices 20C and 20M have common structures except that the structure of each charge control layer 144 included in each first organic layer 14 is different from each other. Thus, a description will be hereinafter given of the structures thereof collectively.

The first electrode layer 13 also functions as a reflecting layer. The first electrode layer 13 is desirably made of a material having high reflectance as much as possible in order to improve light emitting efficiency. The first electrode layer 13 has a thickness of, for example, from 100 nm to 1000 nm both inclusive, and is composed of a simple substance or an alloy of metal elements such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), neodymium (Nd), and gold (Au). The first electrode layer 13 is formed to cover the base substance 11, and fill in a connection hole (not illustrated). The first electrode layer 13 is in a state of being conducted to the drive transistor Tr1 through the connection hole.

Figure 6:
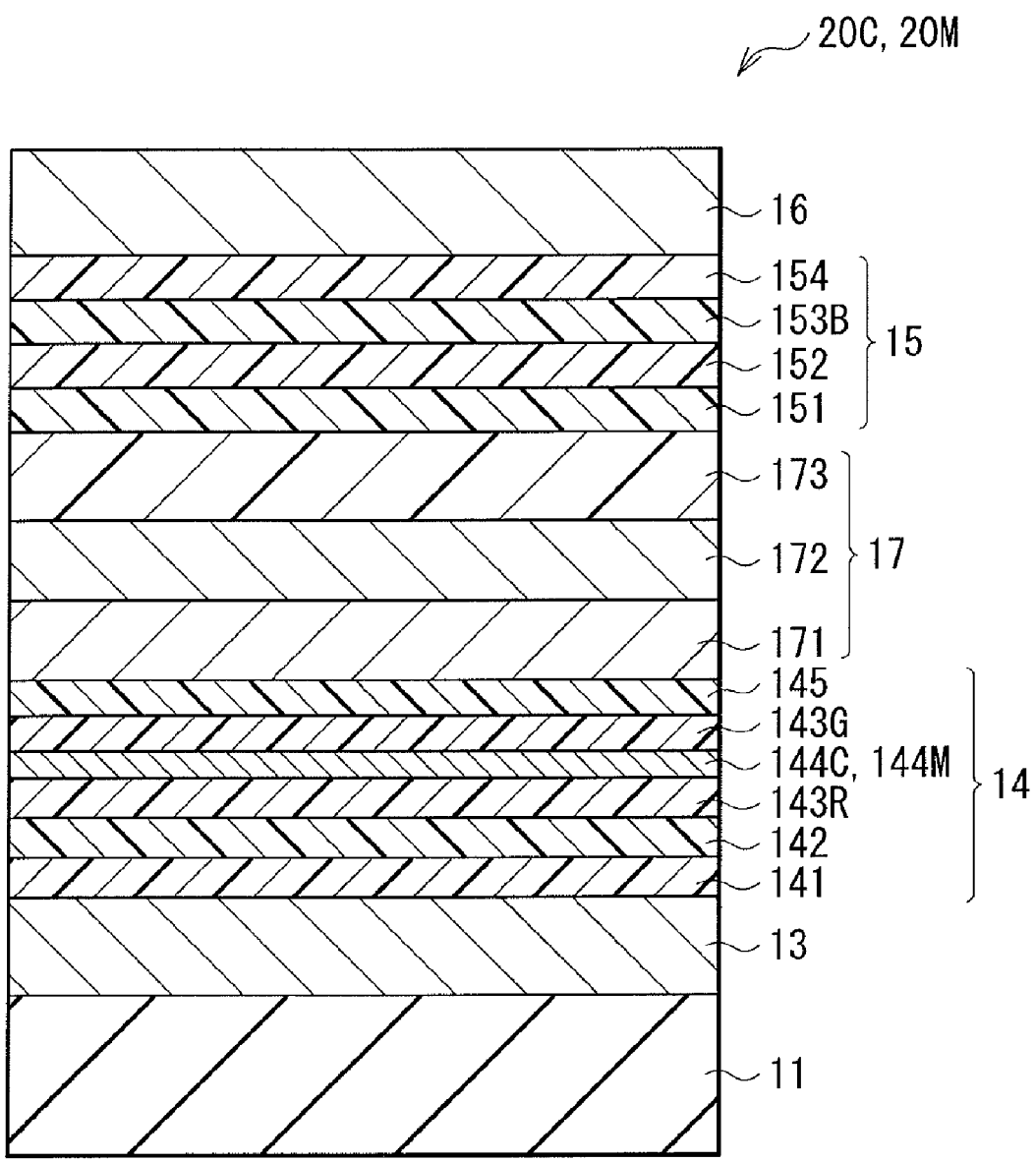
FIG. 6 is an enlarged cross sectional view illustrating a structure of the organic light emitting device illustrated in FIG. 3.

As illustrated in FIG. 6, the first organic layer 14 has a multilayer structure in which a hole injection layer 141, a hole transport layer 142, a red light emitting layer 143R, the charge control layer 144 (144C and 144M), a green light emitting layer 143G, and an electron transport layer 145 are sequentially layered from the first electrode layer 13 side.

The hole injection layer 141 is intended to improve efficiency to inject hole into the red light emitting layer 143R and the green light emitting layer 143G, and function as a buffer layer to prevent current leakage. The hole injection layer 141 is preferably, for example, composed of 4,4',4"-tris(3-methylphenylphenylamino)triphenyl amine (m-MTDATA) or 4,4', 4"-tris(2-naphthylphenylamino)triphenyl amine (2-TNATA), and preferably has a thickness of 10 nm.

The hole transport layer 142 is intended to improve efficiency to transport hole to the red light emitting layer 143R and the green light emitting layer 143G. The hole transport layer 142 is preferably, for example, composed of bis[(N-naphthyl)-N-phenyl]benzidine (α-NPD), and preferably has a thickness of 10 nm.

Figure 7:
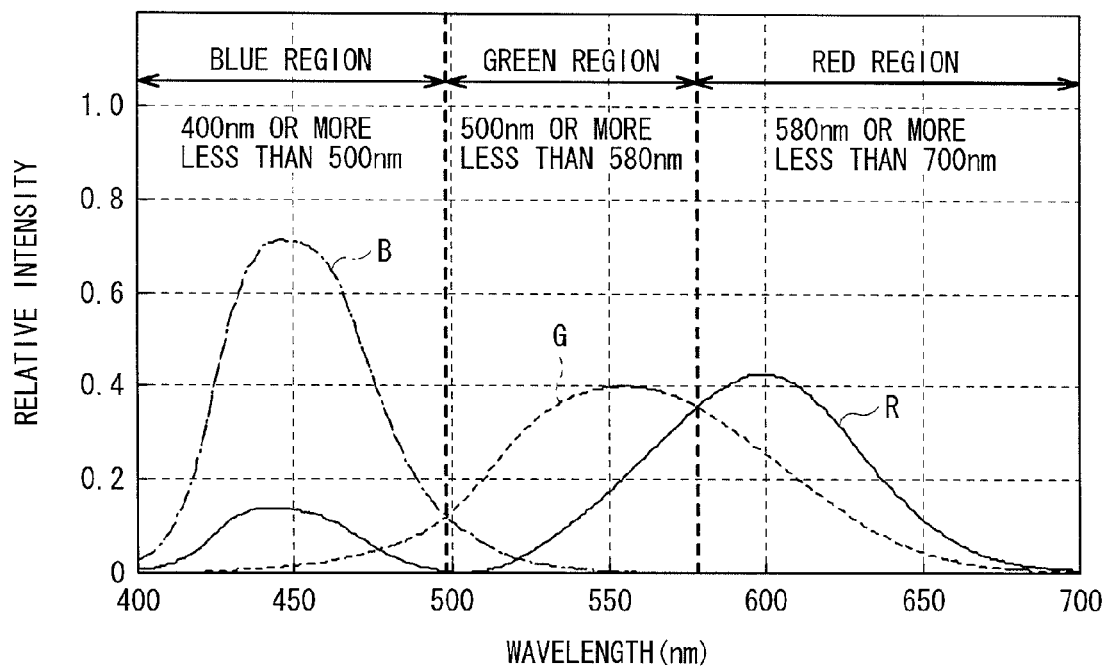
FIG. 7 is a characteristics diagram illustrating ideal wavelength intensity distributions of red light, green light, and blue light respectively output from each light emitting layer illustrated in FIG. 6.

The red light emitting layer 143R and the green light emitting layer 143G generate light of color corresponding to each component material by electron-hole recombination by impressing an electric field. To obtain high visibility spectrum, as the component material of the red light emitting layer 143R and the green light emitting layer 143G, a material that respectively emits the red light R and the green light G having wavelength intensity distribution illustrated in FIG. 7 is desirably selected.

The red light emitting layer 143R is composed of, for example, a mixture obtained by mixing 40 volume % of 2,6-bis[4-[N-(4-methoxy phenyl)-N-phenyl aminostyryl] naphthalene-1,5-dicarbonitril (BSN-BCN) as a guest material with 8-quinolinol aluminum complex (Alq3) having hole transport characteristics as a host material. Otherwise, α-NPD may be used as a host material. In this case, as a guest material, 30 volume % of BSN-BCN is preferably mixed therewith. Meanwhile, the green light emitting layer 143G is composed of, for example, a mixture obtained by mixing 5 wt % of coumarin 6 as a guest material with green light emitting characteristics with ADN (anthracene dinaphtyl) as a host material. It is enough that the host material in the green light emitting layer 143G is a material with higher electron transport characteristics than that of the host material composing the red light emitting layer 143R. Specifically, it is desirable that the energy level of Highest Occupied Molecular Orbital (hereinafter referred to as HOMO) in the host material of the green light emitting layer 143G is lower than that of HOMO in the host material of the red light emitting layer 143R, and in particular, the difference between two HOMOs is 0.2 eV or more. Further, the guest material may be fluorescent or phosphorescent. However, a fluorescent material is preferable since thereby light emitting characteristics are easily controlled. The red light emitting layer 143R and the green light emitting layer 143G preferably have a thickness of, for example, 5 nm and 10 nm, respectively.

The charge control layer 144M in the organic light emitting device 20M is made of a material that promotes injection of electrons into the red light emitting layer 143R and prevents injection of holes into the green light emitting layer 143G, and the charge control layer 144M has a given thickness. Specifically, the charge control layer 144M in the organic light emitting device 20M is preferably made of a material shown in Chemical formula 1 or 8-quinolinol aluminum complex (Alq3), and the thickness thereof is preferably 3 nm or more (most preferably 20 nm). Due to existence of such a charge control layer 144M, electron injected into the green light emitting layer 143G is easily moved to the red light emitting layer 143R, while hole injected into the red light emitting layer 143R is hardly moved to the green light emitting layer 143G. Thus, in the first organic layer 14 of the organic light emitting device 20M, light emission of the red light emitting layer 143R is advantageously generated than light emission of the green light emitting layer 143G.

Chemical formula 1

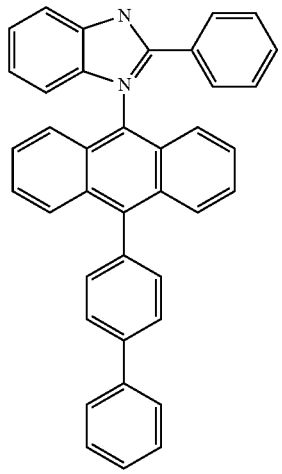

Meanwhile, the charge control layer 144C in the organic light emitting device 20C is made of a material that promotes injection of holes into the green light emitting layer 143G and prevents injection of electrons into the red light emitting layer 143R, and the charge control layer 144C has a given thickness. Specifically, the charge control layer 144C in the organic light emitting device 20C is preferably made of, for example, a material shown in Chemical formula 2, bis[(N-naphthyl)-N-phenyl]benzidine (α-NPD), 4,4',4"-tris(3-methylphenylphenylamino)triphenyl amine (m-MTDATA) or 4,4',4"-tris(2-naphthylphenylamino)triphenyl amine (2-TNATA), and the thickness thereof is preferably 3 nm or more (most preferably 20 nm). Due to existence of such a charge control layer 144C, holes injected into the red light emitting layer 143R are easily moved to the green light emitting layer 143G, while electrons injected into the green light emitting layer 143G are hardly moved to the red light emitting layer 143R. Thus, in the first organic layer 14 of the organic light emitting device 20M, light emission of the green light emitting layer 143G is advantageously generated than light emission of the red light emitting layer 143R.

Chemical formula 2

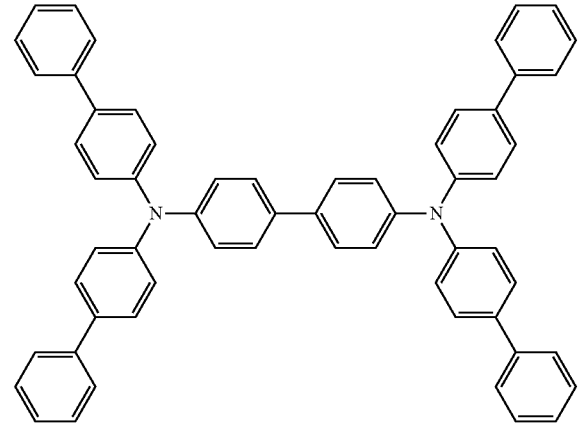

The electron transport layer 145 is intended to improve efficiency to transport electrons to the red light emitting layer 143R and the green light emitting layer 143G. The electron transport layer 145 is, for example, made of $Alq_3$, and has a thickness of 20 nm.

Further, an electron injection layer (not illustrated) composed of LiF, $Li_2O$ or the like may be provided between the electron transport layer 143 and the connection layer 17. In this case, it is desirable that the electron injection layer is a common layer for all the organic light emitting devices 20C and 20M. Further, the foregoing hole injection layer 141, the hole transport layer 142, the electron transport layer 145, and the electron injection layer may respectively have a multi-layer structure composed of a plurality of layers.

The connection layer 17 functions as a charge generation layer. The connection layer 17 injects electrons into the first organic layer 14, and injects holes into the second organic layer 15. In the connection layer 17, for example, an electron injection layer 171, a charge generation layer 172, and a hole injection layer 173 are layered sequentially from the first electrode layer 13 side. The structure of the connection layer 17 is not limited thereto, but the electron injection layer 171 may have a function as the charge generation layer 172. Further, the connection layer 17 may have a structure selected as appropriate according to the structures of the first organic layer 14 and the second organic layer 15 arranged above and below the connection layer 17. For example, the hole injection layer 173 may also have a function as a hole injection layer 151 (described later) of the second organic layer 15 located above the hole injection layer 173.

As the electron injection layer 171, a mixture layer of an electron transport organic material such as 8-hydroxyquinoline aluminum (Alq3) and a reducing metal such as alkali and an alkali earth metal may be used. The charge generation layer 172 is able to be structured by using a material capable of generating electrons and holes such as $V_2O_5$. In particular, a material having work function of 4.5 eV or more is preferable. Further, the hole injection layer 173 is preferably structured by using hexaazatriphenylene.

As illustrated in FIG. 6, the second organic layer 15 has a multilayer structure in which the hole injection layer 151, a hole transport layer 152, a blue light emitting layer 153B, and an electron transport layer 154 are sequentially layered from the connection layer 17 side. The light emitting layer provided in the second organic layer 15, that is, the blue light emitting layer 153B generates electron-hole recombination by being applied with electric field, and thereby emitting the blue light B on shorter wavelength side than that of the red light emitting layer 143R and the green light emitting layer 143G provided in the first organic layer 14. To obtain spectrum with high visibility, a material that emits the blue light B having the wavelength intensity distribution illustrated in FIG. 7 is desirably selected as the component material thereof. Specific examples thereof include a material obtained by using ADN as a host material, and mixing 2.5 wt % of 4,4'-bis[2-{4-(N,N-diphenylamino)phenyl}vinyl]biphenyl (DPAVBi) as a blue light emitting guest material therewith. The blue light emitting layer 153B preferably has, for example, a thickness of 30 nm. The hole injection layer 151, the hole transport layer 152, and the electron transport layer 154 are able to be made of a material similar to that of the hole injection layer 141, the hole transport layer 142, and the electron transport layer 145 in the first organic layer 14.

The second electrode layer 16 has a thickness of, for example, from 5 nm to 50 nm both inclusive, and is composed of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. The second electrode layer 16 is arranged oppositely to the first electrode layer 13 of the respective display devices 10R, 10G, and 10B.

While the first electrode layer 13 has a function as a reflective layer, the second electrode layer 16 has a function as a half-transmissive reflective layer. The first electrode layer 13 and the second electrode layer 16 multiply reflect light generated in the first organic layer 14 and the second organic layer 15. In other words, the organic light emitting devices 20C and 20M have a resonator structure in which each color light generated in the red light emitting layer 143R, the green light emitting layer 143G, and the blue light emitting layer 153B is resonated with the use of the first organic layer 14 and the second organic layer 15 as a resonance section between the top face of the first electrode layer 13 and the bottom face of the second electrode layer 16, and the resonated light is extracted from the second electrode layer 16 side. Since such a resonator structure is included, the half bandwidth of the spectrum of the extracted light is decreased, and color purity is able to be improved. Further, outside light entering from the sealing substrate 19 side is able to be attenuated by multiple reflections. Further, by combining with a phase difference plate and a polarizing plate (not illustrated), the outside light reflectance in the organic light emitting devices 20C and 20M is able to be extremely decreased.

Operation of the Display Unit

In this display unit obtained as above, a scanning signal is supplied from the scanning line drive circuit 130 to the respective pixels through the gate electrode of the writing transistor Tr2, and an image signal from the signal line drive circuit 120 is retained in the retentive capacity Cs through the writing transistor Tr2. Meanwhile, the power source supply line drive circuit 140 supplies the first electric potential higher than the second electric potential to each power source supply line 140A in synchronization with scanning in units of row by the scanning line drive circuit 130. Therefore, conduction state of the drive transistor Tr1 is selected, a drive current Id is injected into the respective organic light emitting devices 20C and 20M, and therefore electron-hole recombination is generated to initiate light emission. The light is multiply reflected between the first electrode layer 13 and the second electrode layer 16, and is transmitted through the second electrode layer 16, the protective film 18, and the sealing substrate 19, and is extracted from the top face.

As illustrated in FIG. 3, the magenta light M extracted from the organic light emitting device 20M of the display device 10R is transmitted through the yellow filter 25Y, and therefore is converted to the red light R. The cyan light C extracted from the organic light emitting device 20C of the display device 10G is transmitted through the yellow filter 25Y, and therefore is converted to the green light G. The cyan light C (the magenta light M) extracted from the organic light emitting device 20C (20M) of the display device 10B is transmitted through the blue filter 25B, and therefore is converted to the blue light B. In the result, the red light R, the green light G, and the blue light B are able to be extracted from the respective pixels 1.

Effect of the First Embodiment

As described above, in the display unit of this embodiment, the cyan light C and the magenta light M are emitted from the organic light emitting device group 20, the cyan light C and the magenta light M entering the color filter group 25 are both converted to the blue light B by the blue filter 25B, and are respectively converted to the green light G and the red light R by the yellow filter 25Y. Therefore, compared to a case that the organic light emitting device group 20 emits white light, color separation is more facilitated. In other words, the thickness of the blue filter 25B and the yellow filter 25Y is able to be decreased without lowering the color purity. Thus, the whole light emitting efficiency is improved, and the thickness of the whole structure is able to be decreased. Further, differently from the case that the organic light emitting device group 20 emits white light, it is possible that only two color filters (the blue filter 25B and the yellow filter 25Y) instead of three color filters are used to extract the red light R, the green light G, and the blue light B. Thus, the structures of the color filter group 25 are simplified. Further, the organic light emitting devices 20C and 20M have the common structure for the section other than the charge control layer 144 included in the first organic layer 14. Thus, in the manufacturing stage, at least one of the section other than the charge control layer 144 in the first organic layer 14 (the hole injection layer 141, the hole transport layer 142, the red light emitting layer 143R, the green light emitting layer 143G, and the electron transport layer 145); the connection layer 17 (the electron injection layer 171, the charge generation layer 172, and the hole injection layer 173); and the second organic layer 15 (the hole injection layer 151, the hole transport layer 152, the blue light emitting layer 153B, and the electron transport layer 154) is not necessarily coated separately for every organic light emitting device, and the manufacturing step is able to be simplified.

Second Embodiment

Next, a description will be given of a display unit including a pixel 2 as a second embodiment with reference to FIG. 8. The pixel 2 has a structure similar to that of the pixel 1 in the first embodiment, except that the structure of the color filter group 25 is different. Thus, in the following description, regarding the pixel 2, for the substantively same elements as those of the pixel 1, the same referential symbols are affixed thereto, and the description thereof will be omitted as appropriate.

Figure 8:
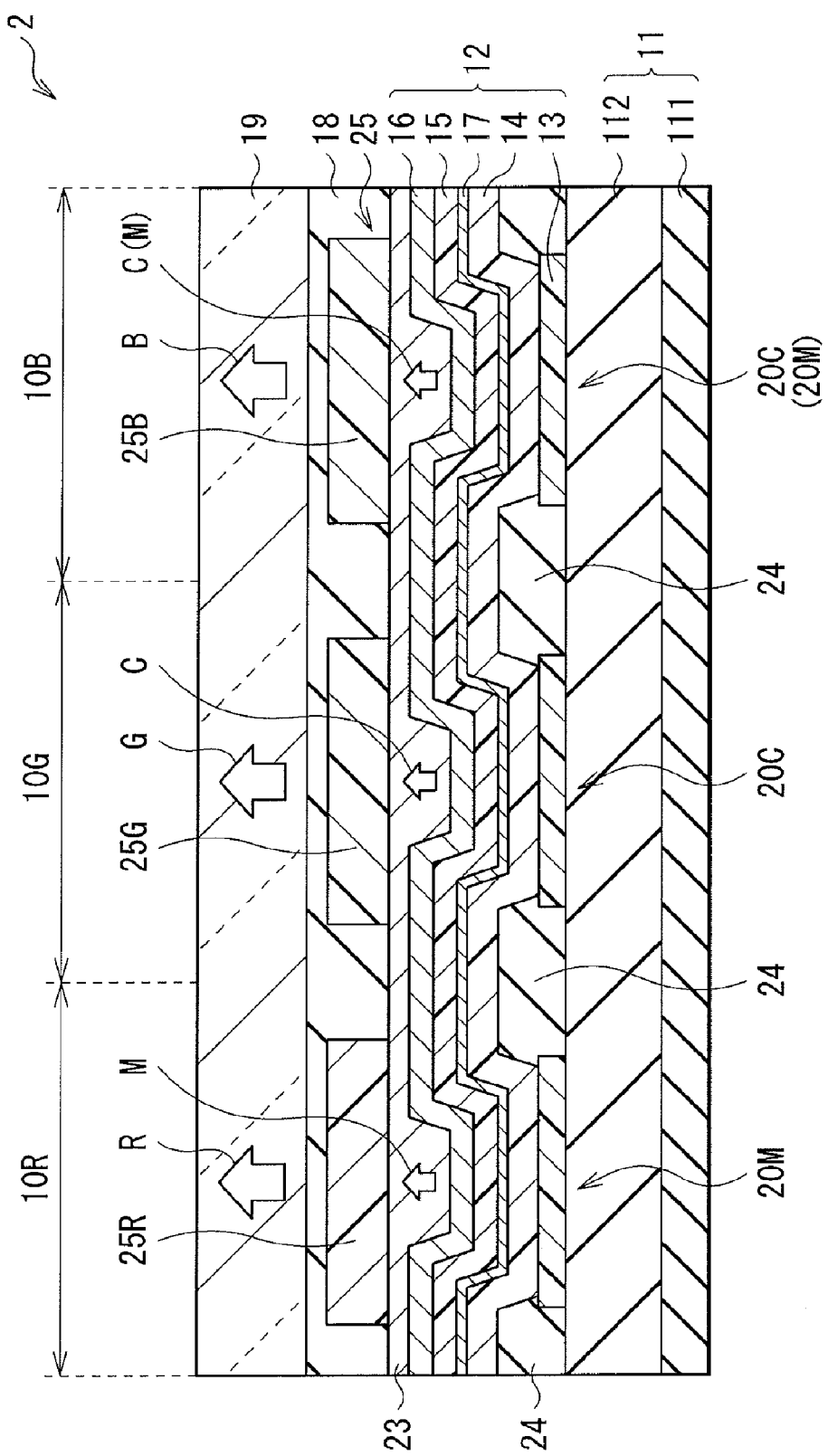
FIG. 8 is a view illustrating a schematic structure of a display device in a display unit according to a second embodiment.

FIG. 8 illustrates a cross sectional structure of the pixel 2, and corresponds to FIG. 3. As illustrated in FIG. 8, in the pixel 2, the color filter group 25 in which a red filter 25R, a green filter 25G, and the blue filter 25B are arranged along the bottom face of the sealing substrate 19 is included. The red filter 25R transmits red light (for example, light with 580 nm to less than 700 nm). The green filter 25G transmits green light (for example, light with 500 nm to less than 580 nm).

In the pixel 2, for example, the display device 10R displays the red light R by combination of the organic light emitting device 20M and the red filter 25R. The display device 10G displays the green light G by combination of the organic light emitting device 20C and the green filter 25G. The display device 10B displays the blue light B by combination of the organic light emitting device 20C and the blue filter 25B, or displays the blue light B by combination of the organic light emitting device 20M and the blue filter 25B as in the pixel 1.

In other words, in the pixel 2, the magenta light M extracted from the organic light emitting device 20M of the display device 10R is transmitted through the red filter 25R, and therefore is converted to the red light R. The cyan light C extracted from the organic light emitting device 20C of the display device 10G is transmitted through the green filter 25G, and therefore is converted to the green light G. The cyan light C (the magenta light M) extracted from the organic light emitting device 20C (20M) of the display device 10B is transmitted through the blue filter 25B, and therefore is converted to the blue light B. In the result, the red light R, the green light G, and the blue light B are able to be extracted from the respective pixels 2.

As described above, in the display unit of this embodiment, the cyan light C and the magenta light M are emitted from the organic light emitting device group 20, the cyan light C and the magenta light M enter the color filter group 25. The cyan light C is converted to the green light G and the blue light B by the green filter 25G and the blue filter 25B, respectively, and the magenta light M entering the color filter group 25 is converted to the red light R and the blue light B by the red filter 25R and the blue filter 25B, respectively. Therefore, compared to a case that the organic light emitting device group 20 emits white light, color separation is more facilitated. In other words, the thickness of the red filter 25R, the green filter 25G, and the blue filter 25B is able to be decreased without lowering the color purity. Thus, the whole light emitting efficiency is improved, and the thickness of the whole structure is able to be decreased. Further, compared to the first embodiment, since the transmissive wavelength region of the red filter 25R (for example, light with 580 nm to less than 700 nm) and the transmissive wavelength region of the green filter 25G (for example, light with 500 nm to less than 580 nm) are narrower than the transmissive wavelength region of the yellow filter 25Y (for example, light with 5000 nm to less than 700 nm), outside light reflection is easily inhibited. Thus, contrast is able to be improved. Further while the yellow filter 25Y transmits both the red light and the green light, the red filter 25R is able to block the green light and the green filter 25G is able to block the red light. Thus, according to this embodiment using the red filter 25R or the green filter 25G, compared to the first embodiment using the yellow filter 25Y, leakage light from an adjacent pixel is able to be more inhibited, and view angle dependence of chromaticity is able to be decreased.

First Modified Example

In the foregoing second embodiment, the organic light emitting device 20M in which the display device 10R emits the magenta light M is included. However, the following structure may be adopted. In other words, the organic light emitting device (not illustrated) in which the display device 10R emits the red light as a first modified example may be included. In this case, the organic light emitting device has a multilayer structure obtained by removing the charge control layer 144M from the organic light emitting device 20M illustrated in FIG. 6. In the case where the foregoing organic light emitting device as the first modified example is included, the display device 10R also displays the red light R in combination with the foregoing red filter 25R.

Third Embodiment

Next, a description will be given of a display unit including a pixel 3 as a third embodiment with reference to FIG. 9 to FIG. 11. The pixel 3 has a structure similar to that of the pixel 2 in the foregoing second embodiment, except that an organic light emitting device group 21 is included instead of the organic light emitting device group 20. Thus, in the following description, regarding the pixel 3, for the substantively same elements as those of the pixels 1 and 2, the same referential symbols are affixed thereto, and the description thereof will be omitted as appropriate.

Figure 9:
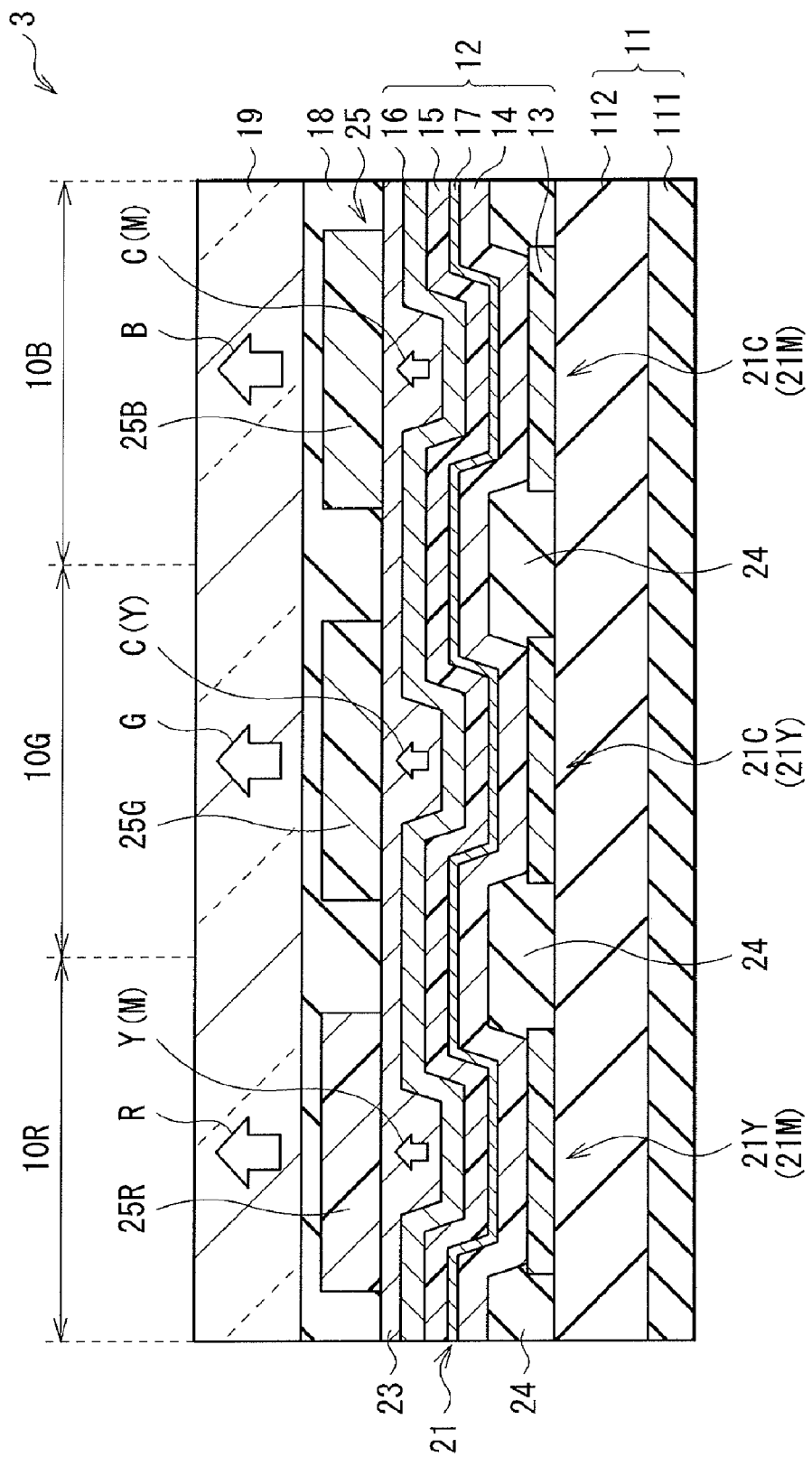
FIG. 9 is a view illustrating a schematic structure of a display device in a display unit according to a third embodiment.

FIG. 9 illustrates a cross sectional structure of the pixel 3, and corresponds to FIG. 8. As illustrated in FIG. 9, in the pixel 3, for example, the display device 10R has an organic light emitting device 21Y emitting yellow light Y and the red filter 25R; the display device 10G has an organic light emitting device 21C and the green filter 25G; and the display device 10B has the organic light emitting device 21C and the blue filter 25B. Otherwise, the display device 10R may have an organic light emitting device 21M and the red filter 25R; the display device 10G may have the organic light emitting device 21Y and the green filter 25G; and the display device 10B may have the organic light emitting device 21M and the blue filter 25B. Structural combinations of the display device 10R, the display device 10G, and the display device 10B are not limited to the foregoing combinations, but may be voluntarily selected.

Figure 10:
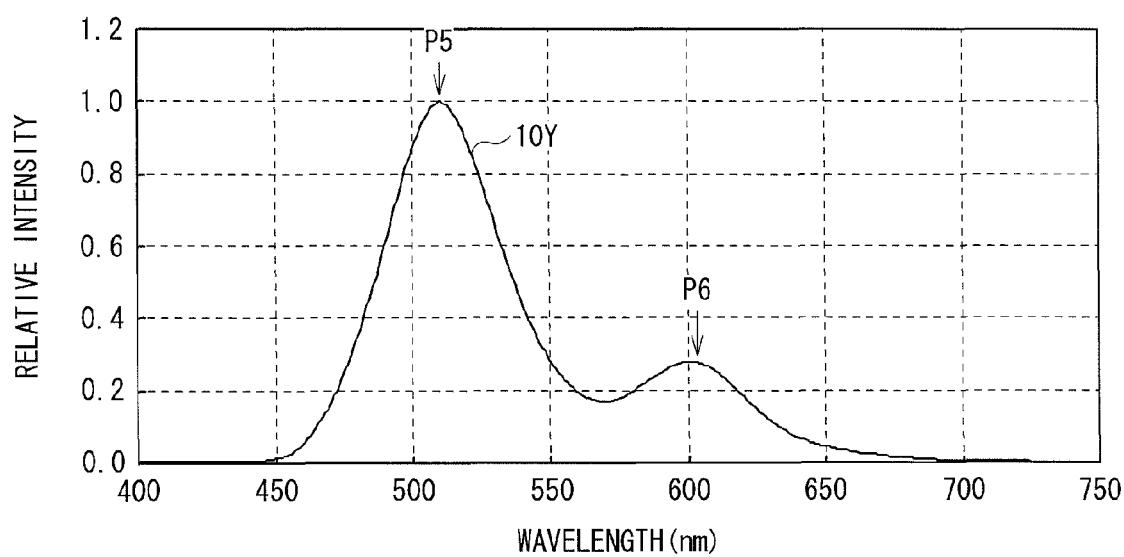
FIG. 10 is a characteristics diagram illustrating an intensity distribution of yellow light.

The yellow light Y is light that has wavelength dependence of intensity indicated by curved line 10Y of FIG. 10, for example. In FIG. 10, the vertical axis represents a relative intensity, and the horizontal axis represents a wavelength [nm]. In other words, the yellow light Y has fifth peak P5 indicating the maximum value in the range from 500 nm to 580 nm both inclusive and sixth peak P6 indicating the maximum value in the range from 580 nm to 700 nm both inclusive in the intensity distribution. The fifth peak P5 indicates the maximum intensity.

Next, a description will be given in detail of the organic light emitting devices 21C, 21M, and 21Y structuring the display devices 10R, 10G, and 10B of the pixel 3. FIG. 11 illustrates a cross sectional structure of the organic light emitting devices 21C, 21M, and 21Y. The organic light emitting devices 21C, 21M, and 21Y have a common structure except that each structure of the charge control layer 144 included in the first organic layer 14 is different from each other, and thus a description will be given collectively As illustrated in FIG. 11, the first organic layer 14 has a multilayer structure in which the hole injection layer 141, the hole transport layer 142, the red light emitting layer 143R, the charge control layer 144 (144C and 144M), a blue light emitting layer 143B, and the electron transport layer 145 are sequentially layered from the first electrode layer 13 side. However, the organic light emitting device 20Y does not have the charge control layer 144. The hole injection layer 141 is intended to improve efficiency to inject holes into the red light emitting layer 143R and the blue light emitting layer 143B, and function as a buffer layer to prevent current leakage. The hole transport layer 142 functions to improve efficiency to transport holes to the red light emitting layer 143R and the blue light emitting layer 143B. The blue light emitting layer 143B has a structure similar to that of the blue light emitting layer 153B illustrated in FIG. 6, and emits the blue light B by electron-hole recombination. Further, the electron transport layer 145 is intended to improve efficiency to transport electrons into the red light emitting layer 143R and the blue light emitting layer 143B.

The charge control layer 144M in the organic light emitting device 20M functions to promote injection of electrons into the red light emitting layer 143R and prevent injection of holes into the blue light emitting layer 143B. Due to existence of such a charge control layer 144M, electrons injected into the blue light emitting layer 143B are easily moved to the red light emitting layer 143R, while holes injected into the red light emitting layer 143R are hardly moved to the blue light emitting layer 143B. Thus, in the first organic layer 14 of the organic light emitting device 21M, light emission of the red light emitting layer 143R is advantageously generated than light emission of the blue light emitting layer 143B.

Meanwhile, the charge control layer 144C in the organic light emitting device 20C functions to promote injection of holes into the blue light emitting layer 143B and prevent injection of electrons into the red light emitting layer 143R. Due to existence of such a charge control layer 144C, holes injected into the red light emitting layer 143R is easily moved to the blue light emitting layer 143B, while electrons injected into the blue light emitting layer 143B is hardly moved to the red light emitting layer 143R. Thus, in the first organic layer 14 of the organic light emitting device 21M, light emission of the blue light emitting layer 143B is advantageously generated than light emission of the red light emitting layer 143R.

Figure 11:
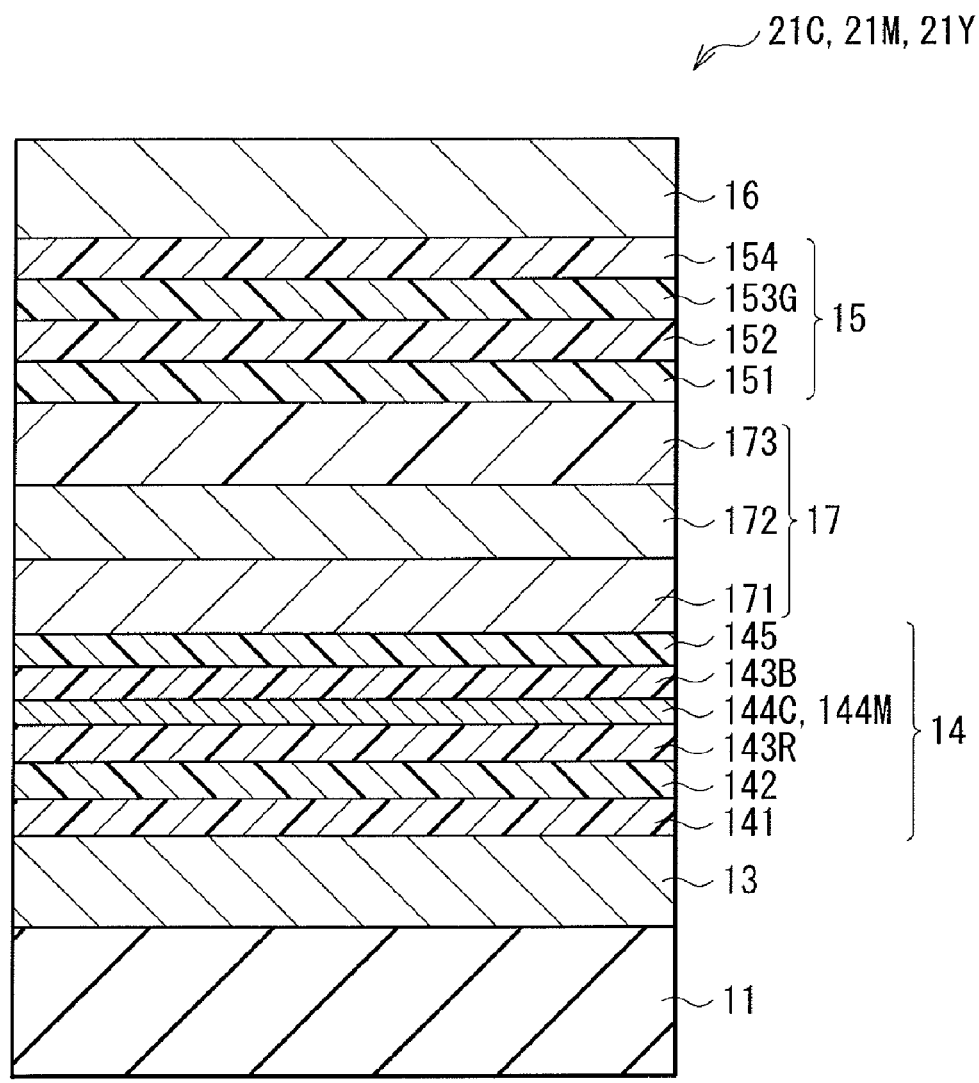
FIG. 11 is an enlarged cross sectional view illustrating a structure of the organic light emitting device illustrated in FIG. 9.

As illustrated in FIG. 11, the second organic layer 15 has a multilayer structure in which the hole injection layer 151, the hole transport layer 152, a green light emitting layer 153G, and the electron transport layer 154 are sequentially layered from the connection layer 17 side. The light emitting layer provided in the second organic layer 15, that is, the green light emitting layer 153G has a structure similar to that of the green light emitting layer 143G illustrated in FIG. 6, and emits the green light G having a wavelength in the range between the red light R from the red light emitting layer 143R and the blue light B from the blue light emitting layer 143B by electron-hole recombination.

As illustrated in FIG. 9, in the pixel 3 having the foregoing structure, the yellow light Y (the magenta light M) extracted from the organic light emitting device 21Y (21M) of the display device 10R is transmitted through the red filter 25R, and therefore is converted to the red light R. The cyan light C (the yellow light Y) extracted from the organic light emitting device 21C (21Y) of the display device 10G is transmitted through the green filter 25G, and therefore is converted to the green light G. The cyan light C (the magenta light M) extracted from the organic light emitting device 21C (21M) of the display device 10B is transmitted through the blue filter 25B, and therefore is converted to the blue light B. In the result, the red light R, the green light G, and the blue light B are able to be extracted from the respective pixels 3.

As described above, in the display unit of this embodiment, at least two of the cyan light C, the magenta light M, and the yellow light Y are emitted from the organic light emitting device group 21, and the emitted light enters the color filter group 25. Thereafter, the yellow light Y is converted to the red light R and the green light G by the red filter 25R and the green filter 25G, respectively, the cyan light C is converted to the green light G and the blue light R by the green filter 25G and the blue filter 25B, respectively, and the magenta light M is converted to the red light R and the blue light B by the red filter 25R and the blue filter 25B, respectively. Therefore, compared to a case that the organic light emitting device group 21 emits white light, color separation is more facilitated. In other words, the thickness of the red filter 25R, the green filter 25G, and the blue filter 25B is able to be decreased without lowering the color purity. Thus, the whole light emitting efficiency is improved, and the thickness of the whole structure is able to be decreased.

Fourth Embodiment

Next, a description will be given of a display unit as a fourth embodiment with reference to FIG. 12. The display unit has a structure similar to that of the foregoing second embodiment, except that organic light emitting devices 22C and 22M are included instead of the organic light emitting devices 20C and 20M. Thus, a description will be hereinafter given of the organic light emitting devices 22C and 22M, and description of other elements will be omitted.

Figure 12:
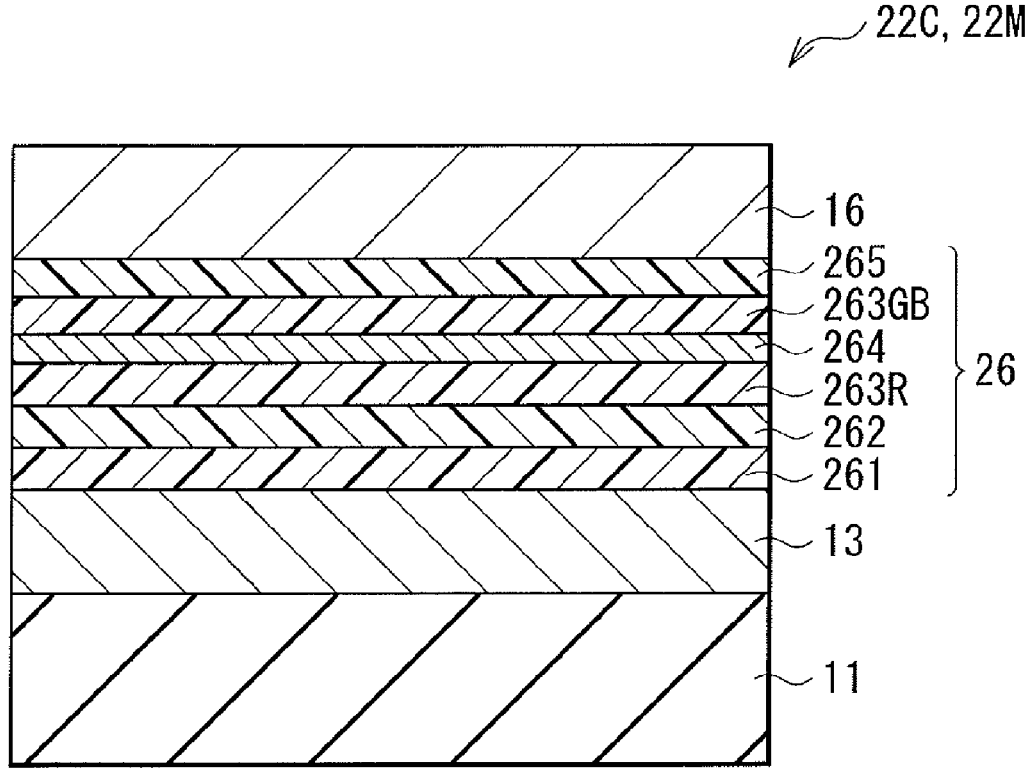
FIG. 12 is an enlarged cross sectional view illustrating a structure of an organic light emitting device in a display unit according to a fourth embodiment.

As illustrated in FIG. 12, in the organic light emitting devices 22C and 22M, the connection layer 17 is not provided, but only one organic layer 26 is provided between the first organic layer 13 and the second electrode layer 16. The organic light emitting devices 22C and 22M have a common structure except for the structure of the charge control layer 264 in the organic layer 26, and thus a description will be given collectively.

The organic layer 26 has a multilayer structure in which a hole injection layer 261, a hole transport layer 262, a red light emitting layer 263R, a charge control layer 264, a common light emitting layer 263GB, and an electron transport layer 265 are sequentially layered from the first electrode layer 13 side. The hole injection layer 261, the hole transport layer 262, the red light emitting layer 263R, the charge control layer 264, and the electron transport layer 265 have structures similar to those of the hole injection layer 141, the hole transport layer 142, the red light emitting layer 143R, the charge control layer 144, and the electron transport layer 145 in FIG. 6.

The common light emitting layer 263GB is composed of a mixture obtained by mixing a guest material having green light emitting characteristics and a guest material having blue light emitting characteristics with a host material having electron transport characteristics. Specific examples include a mixture obtained by mixing 5 wt % of coumarin 6 as a guest material having green light emitting characteristics with ADN (anthracene dinaphtyl) as a host material, and further mixing 2.5 wt % of DPAVBi as a guest material having blue light emitting characteristics therewith.

In the display unit including the organic light emitting devices 22C and 22M having the foregoing structure, effect similar to that of the foregoing second embodiment is able to be obtained as well.

EXAMPLES

A description will be given of examples of the application.

Example 1

In this example, a display unit having the organic light emitting device described in the foregoing second embodiment was fabricated. The structure thereof is illustrated in Table 1. Further, the specific fabrication procedure is as follows. First, after an ITO film having a thickness of 150 nm was formed on the base substance 11, patterning was made in a given shape. Therefore, the first electrode layer 13 as an anode was formed. Next, the device separation layer 24 composed of silicon oxide having a thickness of 2 μm was formed by sputtering method to fill in the surrounding area of the first electrode layer 13.

Next, after 2-TNATA was evaporated on the surface of the first electrode layer 13 to form the hole injection layer 141 having a film thickness of 10 nm, α-NPD was evaporated. Therefore, the hole transport layer 142 having a film thickness of 10 nm was formed. Thereafter, a mixture obtained by mixing 30 wt % of BSN with α-NPD was evaporated, and therefore the red light emitting layer 143R having a thickness of 5 nm was formed.

Thereafter, in the organic light emitting device 20C that would structure the display devices 10G and 10B, the charge control layer 144C having a thickness of 20 nm was formed by evaporating α-NPD. Meanwhile, in the organic light emitting device 20M that would structure the display device 10R, nothing was formed as the charge control layer.

Further, a mixture obtained by mixing 5 wt % of coumarin 6 with ADN was evaporated to have a thickness of 10 nm so that the charge control layer 144C or the red light emitting layer 143R was covered to obtain the green light emitting layer 143G. Thereafter, the electron transport layer 145 having a thickness of 10 nm was formed by using $Alq_3$, and therefore the first organic layer 14 was obtained.

Subsequently, the connection layer 17 composed of a two layer structure of the electron injection layer 171 having a thickness of 5 nm and the charge generation layer 172 having a thickness of 10 nm was formed on the first organic layer 14. The electron injection layer 171 was formed by evaporating a mixture obtained by mixing 10 wt % of lithium (Li) with $Alq_3$. The charge generation layer 172 was formed by evaporating $V_2O_5$.

Subsequently, the second organic layer 15 was formed on the connection layer 17 as follows. First, as the hole injection layer 151, 2-TNATA was evaporated to have a film thickness of 10 nm on the connection layer 17. Next, as the hole transport layer 152, α-NPD was evaporated to have a film thickness of 10 nm. Thereafter, a mixture obtained by mixing 2.5 wt % of DPAVBi with ADN was evaporated to have a film thickness of 30 nm, and therefore the blue light emitting layer 153B was formed. Further, as the electron transport layer 154, $Alq_3$ was evaporated to have a film thickness of 10 nm. Therefore, the second organic layer 15 including the blue light emitting layer 153B was obtained.

Subsequently, an LiF layer having a film thickness of 0.5 nm was formed to cover the second organic layer 15. Further, an aluminum layer having a film thickness of 50 nm was formed, and therefore the second electrode layer 16 as a cathode was formed. Finally, the color filter group 25 having the red filter 25R, the green filter 25G, and the blue filter 25B, the protective layer 18, the sealing substrate 19 and the like were sequentially formed. Therefore, the display unit was completed.

Example 2

A display unit was fabricated in the same manner as that of Example 1, except that the charge control layer 144C in the organic light emitting device 20C was formed by evaporating a material expressed by Chemical Formula 2 instead of α-NPD.

Example 3

A display unit was fabricated in the same manner as that of Example 1, except that the charge control layer 144C in the organic light emitting device 20C was formed by evaporating m-MTDATA instead of α-NPD.

Example 4

A display unit was fabricated in the same manner as that of Example 1, except that the charge control layer 144C in the organic light emitting device 20C was formed by evaporating 2-TNATA instead of α-NPD.

Example 5

A display unit was fabricated in the same manner as that of Example 1, except that $Alq_3$ was evaporated to form a layer having a film thickness of 20 nm as the charge control layer 144M in the organic light emitting device 20M.

Example 6

A display unit was fabricated in the same manner as that of Example 1, except that a material expressed by Chemical formula 1 was evaporated to form a layer having a film thickness of 20 nm as the charge control layer 144M in the organic light emitting device 20M.

Example 7

A display unit was fabricated in the same manner as that of Example 1, except that α-NPD was evaporated to form a layer having a film thickness of 1 nm as the charge control layer 144M in the organic light emitting device 20M.

Example 8

A display unit was fabricated in the same manner as that of Example 1, except that a material expressed by Chemical formula 2 was evaporated to form a layer having a film thickness of 1 nm as the charge control layer 144M in the organic light emitting device 20M.

Example 9

In this example, a display unit having the organic light emitting device (FIG. 11) described in the foregoing third embodiment was fabricated. In other words, a display unit was fabricated in the same manner as that of Example 1, except that the first organic layer 14 and the second organic layer 15 were formed as follows.

For the first organic layer 14, after the charge control layer 144C or the red light emitting layer 143R was formed in the same manner as that of Example 1, a mixture obtained by mixing 2.5 wt % of DPAVBi with ADN was evaporated to have a thickness of 30 nm so that the charge control layer 144C or the red light emitting layer 143R was covered to obtain the blue light emitting layer 143B. Further, $Alq_3$ was evaporated to form the electron transport layer 145 having a thickness of 10 nm, and therefore the first organic layer 14 was obtained.

For the second organic layer 15, after the hole injection layer 151 and the hole transport layer 152 were formed in the same manner as those of Example 1, a mixture obtained by mixing 5 wt % of coumarin 6 with ADN was evaporated to have a thickness of 10 nm, and therefore the green light emitting layer 153G was obtained. Further, as the electron transport layer 154, $Alq_3$ was evaporated to have a film thickness of 10 nm, and therefore the second organic layer 15 was obtained.

Example 10

In this example, a display unit having the organic light emitting device (FIG. 12) described in the foregoing fourth embodiment was fabricated. In other words, a display unit was fabricated in the same manner as that of Example 1, except that the organic layer 26 was formed as follows instead of the first organic layer 14, the connection layer 17, and the second organic layer 15.

For the organic layer 26, after 2-TNATA was evaporated on the surface of the first electrode layer 13 to form the hole injection layer 261 having a film thickness of 10 nm, α-NPD was evaporated thereon. Therefore, the hole transport layer 262 having a film thickness of 10 nm was formed. Thereafter, a mixture obtained by mixing 30 wt % of BSN with α-NPD was evaporated, and therefore the red light emitting layer 263R having a thickness of 5 nm was formed.

Thereafter, in the organic light emitting device 20C that would structure the display devices 10G and 10B, the charge control layer 144C having a thickness of 20 nm was formed by evaporating α-NPD. Meanwhile, in the organic light emitting device 20M that would structure the display device 10R, nothing was formed as the charge control layer.

Further, a mixture obtained by mixing 5 wt % of coumarin 6 and 2.5 wt % of DPAVBi with ADN as a host material was evaporated to have a thickness of 10 nm so that the charge control layer 144C or the red light emitting layer 143R was covered to obtain the common light emitting layer 263G. Further, the electron transport layer 145 having a thickness of 10 nm was formed by using Alq$_3$, and therefore the organic layer 26 was obtained.

Example 11

A display unit was fabricated in the same manner as that of Example 1, except that the charge control layer 144C in the organic light emitting device 20C and the charge control layer 144M in the organic light emitting device 20M were formed to have a thickness of 3 nm by using α-NPD.

Example 12

A display unit was fabricated in the same manner as that of Example 1, except that the charge control layer 144C in the organic light emitting device 20C and the charge control layer 144M in the organic light emitting device 20M were formed to have a thickness of 20 nm by using α-NPD.

Example 13

A display unit was fabricated in the same manner as that of Example 1, except that the charge control layer 144C in the organic light emitting device 20C and the charge control layer 144M in the organic light emitting device 20M were formed to have a thickness of 20 nm by using Alq$_3$.

Example 14

A display unit was fabricated in the same manner as that of Example 1, except that the charge control layer 144C in the organic light emitting device 20C and the charge control layer 144M in the organic light emitting device 20M were not formed.

Example 15

A display unit was fabricated in the same manner as that of Example 1, except that the charge control layer 144M in the organic light emitting device 20M was formed by evaporating α-NPD to form a layer having a film thickness of 20 nm, and the charge control layer 144C in the organic light emitting device 20C was formed to have a thickness of 30 nm by using α-NPD.

Example 16

A display unit was fabricated in the same manner as that of Example 1, except that the charge control layer 144M in the organic light emitting device 20M was formed by evaporating a material expressed by Chemical formula 2 to form a layer having a film thickness of 20 nm, and the charge control layer 144C in the organic light emitting device 20C was formed to have a thickness of 30 nm by using α-NPD.

Example 17

A display unit was fabricated in the same manner as that of Example 10, except that the charge control layer 264 in the organic layer 26 was not formed.

TABLE 1

| | Structure of charge control layer | | Structure of organic light emitting device |
|---|---|---|---|
| | 10R | 10G and 10B | |
| Example 1 | Absent | α-NPD (20 nm) | FIG. 6 |
| Example 2 | Absent | Chemical formula 2 (20 nm) | FIG. 6 |
| Example 3 | Absent | mMTDATA (20 nm) | FIG. 6 |
| Example 4 | Absent | 2-TNATA (20 nm) | FIG. 6 |
| Example 5 | Alq$_3$ (20 nm) | α-NPD (20 nm) | FIG. 6 |
| Example 6 | Chemical formula 1 (20 nm) | α-NPD (20 nm) | FIG. 6 |
| Example 7 | α-NPD (1 nm) | α-NPD (20 nm) | FIG. 6 |
| Example 8 | Chemical formula 2 (1 nm) | α-NPD (20 nm) | FIG. 6 |
| Example 9 | Absent | α-NPD (20 nm) | FIG. 11 |
| Example 10 | Absent | α-NPD (20 nm) | FIG. 12 |
| Example 11 | α-NPD (3 nm) | | FIG. 6 |
| Example 12 | α-NPD (20 nm) | | FIG. 6 |
| Example 13 | Alq$_3$ (20 nm) | | FIG. 6 |
| Example 14 | Absent | | FIG. 6 |
| Example 15 | α-NPD (20 nm) | α-NPD (30 nm) | FIG. 6 |
| Example 16 | Chemical formula 2 (20 nm) | α-NPD (30 nm) | FIG. 6 |
| Example 17 | Absent | Absent | FIG. 12 |

In Examples 1 to 10, based on the foregoing structure, the organic light emitting device 20M structuring the display device 10R emits the magenta light M, and the organic light emitting device 20M structuring the display devices 10G and 10B emits the cyan light C. Meanwhile, in Example 11, the organic light emitting devices 20C and 20M structuring the display devices 10R, 10G, and 10B emit white light. In Examples 12, 15, and 16, the organic light emitting devices 20C and 20M structuring the display devices 10R, 10G, and 10B emit the cyan light C. In Examples 13, 14, and 17, the organic light emitting devices 20C and 20M structuring the display devices 10R, 10G, and 10B emit the magenta light M. Further, for the display units as the foregoing respective examples, evaluation thereof (comparison of chromaticity and light emitting efficiency of light transmitted through the color filter group) was made. The results are illustrated in Table 2 all together.

TABLE 2

| | Chromaticity (CIEx and CIEy) | | | Light emitting efficiency (cd/A) | | |
| --- | --- | --- | --- | --- | --- | --- |
| | R | G | B | R | G | B |
| Example 1 | 0.665, 0.350 | 0.260, 0.722 | 0.144, 0.090 | 2.8 | 6.3 | 1.0 |
| Example 2 | 0.654, 0.350 | 0.260, 0.723 | 0.144, 0.092 | 2.8 | 6.4 | 1.1 |
| Example 3 | 0.656, 0.350 | 0.262, 0.724 | 0.143, 0.090 | 2.8 | 5.9 | 1.1 |
| Example 4 | 0.655, 0.350 | 0.260, 0.725 | 0.144, 0.090 | 2.8 | 5.8 | 1.0 |
| Example 5 | 0.655, 0.351 | 0.261, 0.726 | 0.145, 0.091 | 2.6 | 6.3 | 1.0 |
| Example 6 | 0.655, 0.350 | 0.260, 0.727 | 0.144, 0.092 | 2.7 | 6.3 | 1.0 |
| Example 7 | 0.655, 0.350 | 0.260, 0.728 | 0.144, 0.093 | 2.5 | 6.3 | 1.0 |
| Example 8 | 0.655, 0.350 | 0.260, 0.729 | 0.144, 0.090 | 2.5 | 6.3 | 1.0 |
| Example 9 | 0.657, 0.344 | 0.255, 0.740 | 0.147, 0.099 | 2.6 | 8.4 | 0.6 |
| Example 10 | 0.655, 0.350 | 0.260, 0.722 | 0.144, 0.090 | 2.8 | 3.3 | 0.5 |
| Example 11 | 0.658, 0.347 | 0.263, 0.725 | 0.146, 0.091 | 2.0 | 4.2 | 1.1 |
| Example 12 | 0.625, 0.409 | 0.260, 0.728 | 0.144, 0.089 | 0.7 | 6.4 | 1.2 |
| Example 13 | 0.655, 0.350 | 0.260, 0.701 | 0.144, 0.090 | 2.6 | 1.2 | 1.2 |
| Example 14 | 0.655, 0.351 | 0.260, 0.703 | 0.144, 0.091 | 2.8 | 1.1 | 1.1 |
| Example 15 | 0.625, 0.409 | 0.260, 0.731 | 0.144, 0.092 | 0.7 | 5.4 | 1.2 |
| Example 16 | 0.625, 0.409 | 0.260, 0.732 | 0.144, 0.093 | 0.6 | 5.4 | 1.0 |
| Example 17 | 0.655, 0.350 | — | — | 2.8 | <0.1 | <0.1 |

As is able to be seen from Table 2, it is found that according to Examples 1 to 10 corresponding to the display unit of the application, the red light R, the green light G, and the blue light B were able to be more effectively emitted. Such a result may be generated for the following reason. That is, at least two of the cyan light, the magenta light, and the yellow light were emitted from the organic light emitting device group.

While the application has been described with reference to several embodiments and several examples, the application is not limited to the foregoing embodiments and the like, and various modifications may be made. For example, the material, the thickness, the film-forming method, the film-forming conditions and the like of each layer are not limited to those described in the foregoing embodiments and the like, but other material, other thickness, other film-forming method, and other film-forming conditions may be adopted.

Further, in the foregoing first embodiment and the like, the description has been given of the case in which the first organic layer 14 (first light emitting unit), the connection layer 17 (charge generation layer), and the second organic layer 15 (second light emitting unit) are layered in this order over the first electrode layer 13 (first electrode layer). However, it may be possible that the arrangement relation between the first organic layer 14 and the second organic layer 15 may be reversed. In other words, it may be possible to adopt a structure in which the second organic layer 15, the connection layer 17, and the first organic layer 14 are layered in this order over the first electrode layer 13.

Further, in the foregoing embodiment and the like, the description has been given of the example of the top face light emitting type display device in which light is extracted from the second electrode layer 16 side as the upper electrode. However, the application is able to be applied to a bottom face light emitting type display device in which light is extracted from the base substance 11 side by using the base substance 11 made of a transparent material. Further, emitted light is able to be extracted from both the top face and the bottom face by using a transparent electrode as the first electrode layer 13 and the second electrode layer 16.

Further, in the foregoing embodiment, the description has been specifically given of the structure of the organic light emitting device. However, it is not always necessary to provide all layers, and other layer may be further provided.

Further, in the foregoing respective embodiments, the description has been given of the case of the active matrix type display unit. However, the application is able to be also applied to a passive matrix type display unit. Furthermore, the structure of the pixel drive circuit for driving the active matrix is not limited to the structure described in the foregoing respective embodiments. If necessary, a capacity device or a transistor may be added. In this case, according to the change of the pixel drive circuit, a necessary drive circuit may be added in addition to the foregoing signal line drive circuit 120 and the scanning line drive circuit 130.

Further, in the foregoing respective embodiments, the description has been given of the case in which the display devices 10R, 10G, and 10B composing one pixel are arranged in line in this order as an example. However, the arrangement thereof is not limited thereto. The arrangement is able to be selected as appropriate according to the purpose.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display unit comprising:
    a multilayer structure in which a light emitting device group that respectively has a plurality of first organic light emitting devices emitting a first light and a plurality of second organic light emitting devices emitting a second light and a color filter group that has a plurality of blue filters transmitting blue light and a plurality of yellow filters transmitting yellow light are sequentially layered over a substrate;
    wherein the first light has a first peak indicating the maximum value in the range from 400 nm to 500 nm both inclusive and a second peak indicating the maximum value in the range from 500 nm to 580 nm both inclusive in the intensity distribution and the first peak or the second peak indicates the maximum intensity, and
    the second light has a third peak indicating the maximum value in the range from 400 nm to 500 nm both inclusive and a fourth peak indicating the maximum value in the range from 600 nm to 700 nm both inclusive in the intensity distribution, and the third peak or the fourth peak indicates the maximum intensity.
2. The display unit according to claim 1, wherein the plurality of yellow filters are arranged so that the first light from the first organic light emitting device enters part of the plurality of yellow filters and the second light from the second organic light emitting device enters the other part of the plurality of yellow filters, and
    the plurality of blue filters are arranged so that at least one of the first light from the first organic light emitting device and the second light from the second organic light emitting device enters the plurality of blue filters.

3. A display unit comprising: a multilayer structure in which a light emitting device group that respectively has a plurality of first organic light emitting devices emitting a first light and a plurality of second organic light emitting devices emitting a second light and a color filter group that has a plurality of blue filters transmitting blue light and a plurality of yellow filters transmitting yellow light are sequentially layered over a substrate, wherein both the first organic light emitting device and the second organic light emitting device have a sequentially layered structure that comprises: first electrode layer, a first light emitting unit including a first light emitting layer and a second light emitting layer that each emit a color of light different from each other, a charge generation layer, and a second light emitting unit including a third light emitting layer that emits a color of light different from the color light of the first light emitting layer and the second light emitting layer.

4. The display unit according to claim 3, wherein the first electrode layer is an anode,
a second electrode layer is a cathode,
the first light emitting unit includes a first hole transport layer, a red light emitting layer as the first light emitting layer, a charge control layer, a green light emitting layer as the second light emitting layer, and a first electron transport layer sequentially from the first electrode layer side, and
the second light emitting unit includes a second hole transport layer, a blue light emitting layer as the third light emitting layer, and a second electron transport layer sequentially from the first electrode layer side.

5. The display unit according to claim 4, wherein the charge control layer in the second organic light emitting device is made of a material that promotes injection of electrons into the red light emitting layer and prevents injection of holes into the green light emitting layer, and
the charge control layer in the first organic light emitting device is made of a material that promotes injection of holes into the green light emitting layer and prevents injection of electrons into the red light emitting layer.

6. The display unit according to claim 4, wherein the charge control layer in the second organic light emitting device is made of a material shown in Chemical formula 1 or 8-quinolinol aluminum complex ($Alq_3$), and
the charge control layer in the first organic light emitting device is made of a material shown in Chemical formula 2, bis[(N-naphthyl)-N-phenyl]benzidine ($\alpha$-NPD), 4,4',4"-tris (3-methylphenylphenylamino)triphenyl amine (m-MTDATA) or 4,4',4"-tris(2-naphthylphenylamino)triphenyl amine (2-TNATA),

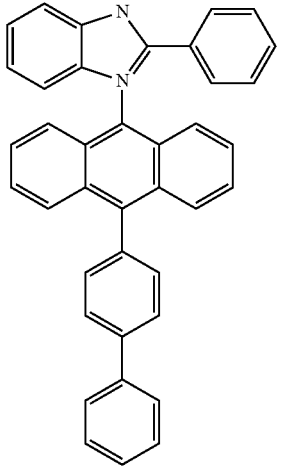

Chemical formula 1

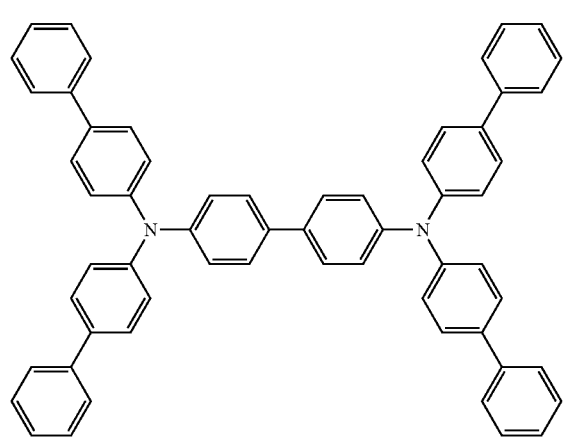

Chemical formula 2

7. The display unit according to claim 3, wherein the charge generation layer injects electrons into the first light emitting unit and injects holes into the second light emitting unit.

* * * * *